(12) United States Patent
Shirasaka et al.

(10) Patent No.: US 12,378,670 B2
(45) Date of Patent: Aug. 5, 2025

(54) SUBSTRATE PROCESSING METHOD

(71) Applicant: Tokyo Electron Limited, Tokyo (JP)

(72) Inventors: Tetsuro Shirasaka, Koshi (JP); Naoto Nakamura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 30 days.

(21) Appl. No.: 18/408,801

(22) Filed: Jan. 10, 2024

(65) Prior Publication Data
US 2024/0141501 A1 May 2, 2024

Related U.S. Application Data

(62) Division of application No. 17/434,160, filed as application No. PCT/JP2020/005872 on Feb. 14, 2020, now Pat. No. 11,905,597.

(30) Foreign Application Priority Data

Feb. 28, 2019 (JP) ................. 2019-035707

(51) Int. Cl.
*C23C 18/16* (2006.01)
*B05B 14/00* (2018.01)
(Continued)

(52) U.S. Cl.
CPC .......... *C23C 18/1603* (2013.01); *B05B 14/00* (2018.02); *C23C 18/163* (2013.01);
(Continued)

(58) Field of Classification Search
CPC .............. C23C 18/1603; C23C 18/163; C23C 18/1678
See application file for complete search history.

(56) References Cited

U.S. PATENT DOCUMENTS 5,834,737 A 11/1998 Hirose
2005/0150451 A1 7/2005 Tanaka et al.
(Continued)

FOREIGN PATENT DOCUMENTS

JP H07-142332 A 6/1995
JP 2004-260189 A 9/2004
(Continued)

OTHER PUBLICATIONS

International Search Report for PCT/JP2020/005872 dated Mar. 17, 2020.

*Primary Examiner* — Dah-Wei D. Yuan
*Assistant Examiner* — Kristen A Dagenais
(74) *Attorney, Agent, or Firm* — Chrisman Gallo Tochtrop LLC

(57) ABSTRACT

A controller performs an adjustment processing including: forming a film on a surface of a substrate by a film forming unit; removing a peripheral portion of the film by the film forming unit; acquiring surface information indicating a state of the surface of the substrate including the film, from which the peripheral portion has been removed, by a surface inspection unit and adjusting a cut width of the peripheral portion based on the surface information; and peeling the film, from which the peripheral portion has been removed, by the film forming unit, and a process processing including: forming the film on the surface of the substrate by the film forming unit; and removing the peripheral portion by the cut width adjusted in the adjustment processing in the film forming unit.

9 Claims, 13 Drawing Sheets

(51) Int. Cl.
　　　*G03F 7/16*　　　(2006.01)
　　　*H01L 21/67*　　(2006.01)

(52) U.S. Cl.
　　　CPC .......... *C23C 18/1678* (2013.01); *G03F 7/162* (2013.01); *H01L 21/6715* (2013.01); *H01L 21/67253* (2013.01)

(56) References Cited

U.S. PATENT DOCUMENTS

2017/0287699 A1* 10/2017 Fujita .................. G03F 7/168
2019/0057890 A1　　2/2019 Sato

FOREIGN PATENT DOCUMENTS

| JP | 2008-244328 A | 10/2008 |
| JP | 2013-168429 A | 8/2013 |
| JP | 2017-183496 A | 10/2017 |
| JP | 2017-183512 A | 10/2017 |
| KR | 10-2001-0036461 A | 5/2001 |
| KR | 10-2012-0116351 A | 10/2012 |

* cited by examiner

SUBSTRATE PROCESSING METHOD

CROSS-REFERENCE TO RELATED APPLICATION

This is a divisional application of U.S. patent application Ser. No. 17/434,160 filed Aug. 26, 2021, which is a U.S. national phase application under 35 U.S.C. § 371 of PCT Application No. PCT/JP2020/005872 filed on Feb. 14, 2020, which claims the benefit of Japanese Patent Application No. 2019-035707 filed on Feb. 28, 2019, the entire disclosures of which are incorporated herein by reference.

TECHNICAL FIELD

The various aspects and exemplary embodiments described herein pertain generally to a substrate processing apparatus, a substrate processing method and a recording medium.

BACKGROUND

Patent Document 1 discloses a liquid processing apparatus equipped with a substrate holder that holds a circular substrate horizontally and rotates the substrate about a vertical axis and a chemical liquid nozzle that supplies a chemical liquid to a peripheral portion of the substrate in order to remove a film of the peripheral portion of the substrate being rotated by the substrate holder. This liquid processing apparatus includes a determination unit that calculates a deviation amount between a rotation center of the substrate holder and a center of the substrate based on an imaging result acquired by imaging a plurality of image capture areas equally spaced in a circumferential direction on the peripheral portion of substrate.

Patent Document 1: Japanese Patent Laid-open Publication No. 2013-168429

SUMMARY

A substrate processing apparatus includes a film forming unit configured to form a film on a surface of a substrate and remove at least a part of the film; a surface inspection unit configured to acquire surface information indicating a state of the surface of the substrate; and a controller configured to control the film forming unit and the surface inspection unit. The controller performs an adjustment processing including: forming the film on the surface of the substrate by the film forming unit; removing a peripheral portion of the film by the film forming unit; acquiring the surface information indicating the state of the surface of the substrate including the film, from which the peripheral portion has been removed, by the surface inspection unit and adjusting a cut width of the peripheral portion based on the surface information; and peeling the film, from which the peripheral portion has been removed, by the film forming unit, and a process processing including: forming the film on the surface of the substrate by the film forming unit; and removing the peripheral portion by the cut width adjusted in the adjustment processing in the film forming unit.

DETAILED DESCRIPTION

Figure 1:
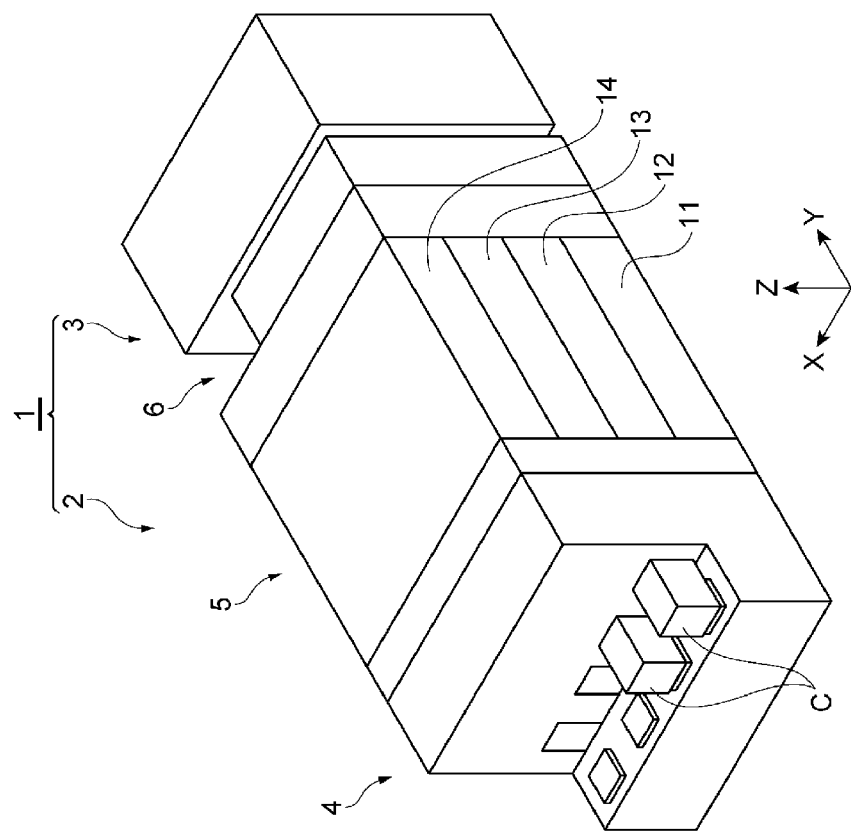
FIG. 1 is a schematic diagram illustrating an example configuration of a substrate processing system.

Hereinafter, various exemplary embodiments will be described. In the following description, same parts or parts having same function will be assigned same reference numerals, and redundant description will be omitted. In the following, in order to clarify positional relationships, the X-axis, Y-axis and Z-axis which are orthogonal to each other will be defined. The positive Z-axis direction will be regarded as a vertically upward direction.

[Substrate Processing System]

A substrate processing system 1 is configured to form a photosensitive film on a substrate, expose the photosensitive film and develop the photosensitive film. A processing target substrate is, for example, a semiconductor wafer W. The wafer W is circular. A periphery We of the wafer W may have a notch serving as a recess for indicating the orientation of the wafer W. The photosensitive film is, for example, a resist film.

The substrate processing system 1 includes a coating/developing apparatus 2 and an exposure apparatus 3. The exposure apparatus 3 is configured to perform an exposure processing of the resist film (photosensitive film) formed on the wafer W (substrate). Specifically, the exposure apparatus 3 radiates an energy ray to an exposure target portion of the resist film through immersion lithography or the like. The coating/developing apparatus 2 performs a processing of forming the resist film on the surface of the wafer W (substrate) before the exposure processing by the exposure apparatus 3, and performs a developing processing of the resist film after the exposure processing.

[Substrate Processing Apparatus]

Figure 2:
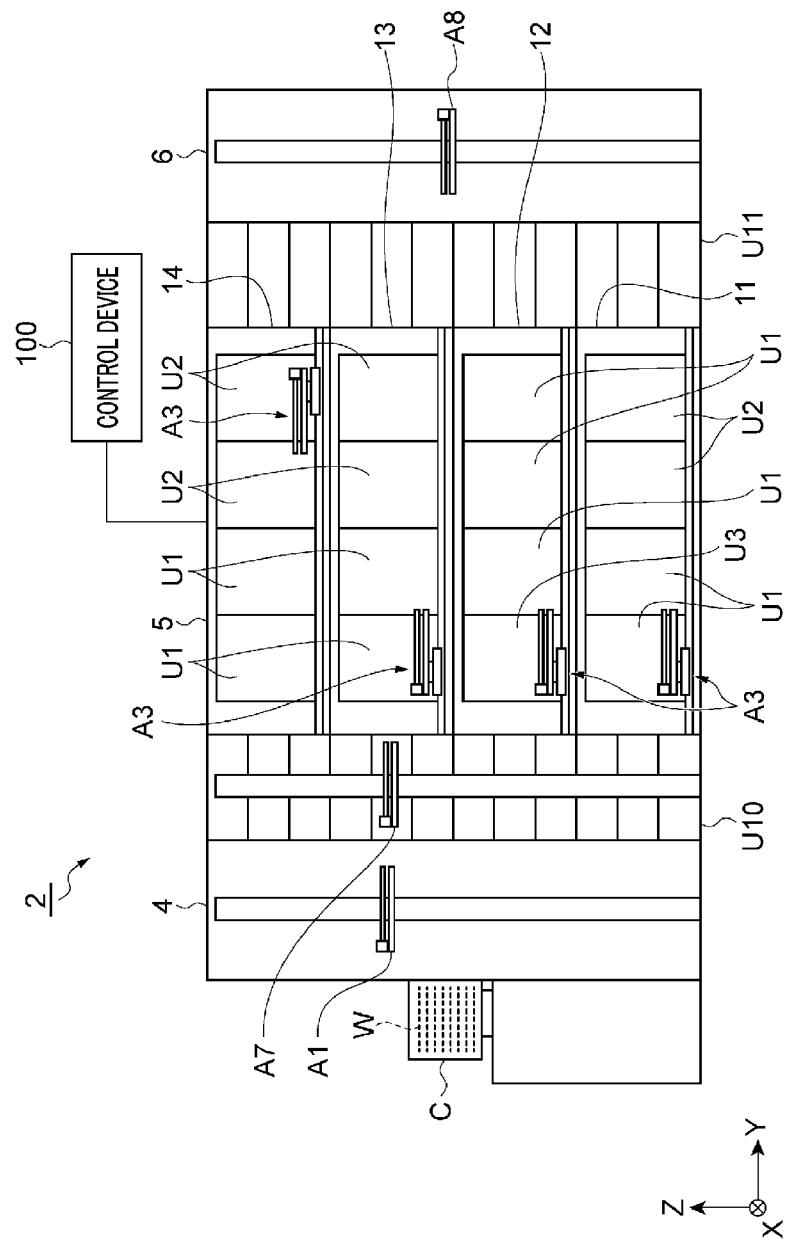
FIG. 2 is a schematic diagram illustrating an example internal configuration when viewed from a side of a coating/developing apparatus.

Hereinafter, a configuration of the coating/developing apparatus 2 which is an example of a substrate processing apparatus will be described. As illustrated in FIG. 1 and FIG. 2, the coating/developing apparatus 2 includes a carrier block 4, a processing block 5, an interface block 6 and a control device 100 (controller).

The carrier block 4 is configured to carry the wafer W into/from the coating/developing apparatus 2. For example, the carrier block 4 is configured to support a plurality of carriers C (accommodation units) for wafers W and includes therein a transfer device A1 including a delivery arm. Each carrier C is configured to accommodate therein, for example, a plurality of circular wafers W. The transfer device A1 is configured to take out the wafer W from the carrier C to deliver the wafer W to the processing block 5, and receive the wafer W from the processing block 5 to return the wafer W back into the carrier C. The processing block 5 includes a plurality of processing modules 11, 12, 13 and 14.

The processing module 11 includes therein a plurality of coating units U1, a plurality of heat treatment units U2 and a transfer device A3 configured to transfer the wafer W to these units. The processing module 11 is configured to form a base film on the surface of the wafer W by the coating units U1 and the heat treatment units U2. Each of the coating units U1 of the processing module 11 is configured to coat the wafer W with a processing liquid for forming the base film. The heat treatment units U2 of the processing module 11 perform various heat treatments required for forming the base film. Each of the heat treatment units U2 includes therein, for example, a heating plate and a cooling plate, and is configured to perform a heat treatment by heating the wafer W with the heating plate and by cooling the heated wafer W with the cooling plate.

Figure 3:
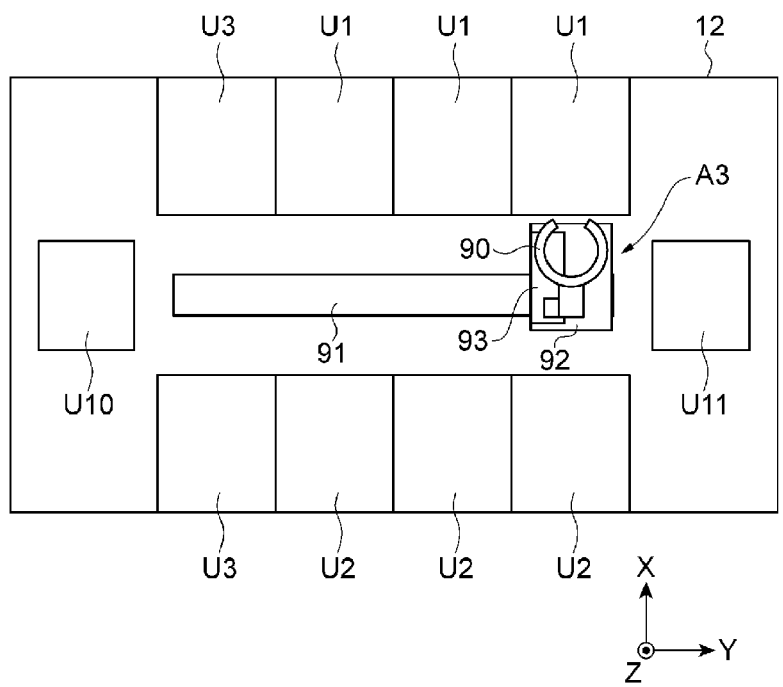
FIG. 3 is a schematic diagram illustrating an example internal configuration when viewed from a top of the coating/developing apparatus.

The processing module 12 (film forming unit) includes therein a plurality of coating units U1, a plurality of heat treatment units U2, a plurality of inspection units U3 and a transfer device A3 configured to transfer the wafer W to these units (see FIG. 3). The processing module 12 is configured to form a resist film on the base film by the coating units U1 and the heat treatment units U2. Each of the coating units U1 of the processing module 12 is configured to form a coating film AF on the surface of the wafer W by coating the base film with a processing liquid for forming the resist film. Also, each of the coating units U1 of the processing module 12 is configured to remove at least a part of the film. For example, each of the coating units U1 of the processing module 12 is configured to form a coating film (hereinafter, referred to as "coating film RF") of which a peripheral portion has been removed by removing a peripheral portion of the coating film AF after the coating film AF is formed. When the peripheral portion of the coating film AF is removed, each of the coating units U1 of the processing module 12 coats the coating film AF with a chemical liquid for removing the peripheral portion of the coating film AF. Each of the coating units U1 of the processing module 12 may also remove the peripheral portion of the coating film AF along an entire circumference of the wafer W.

The heat treatment units U2 of the processing module 12 perform various heat treatments required for forming the resist film. Each of the heat treatment units U2 of the processing module 12 is configured to form a resist film R by performing a heat treatment on the wafer W on which the coating film RF is formed. Each of the inspection units U3 is configured to perform a processing of inspecting a state of a surface Wa of the wafer W. For example, each of the inspection units U3 acquires information (hereinafter, referred to as "surface information") indicating the state of the surface Wa of the wafer W. Further, in the following description, the coating film AF, the coating film RF and the resist film R may also be collectively referred to as "resist coating film". As described above, the processing module 12 includes a plurality of coating units U1 (a plurality of processing units) configured to form the resist coating film on the surface Wa of the wafer W and removes at least a part of the resist coating film.

The processing module 13 includes therein a plurality of coating units U1, a plurality of heat treatment units U2 and a transfer device A3 configured to transfer the wafer W to these units. The processing module 13 is configured to form an upper film on the resist film R by the coating units U1 and the heat treatment units U2. Each of the coating units U1 of the processing module 13 is configured to coat the resist film R with a liquid for forming the upper film. The heat treatment units U2 of the processing module 13 perform various heat treatments required for forming the upper film.

The processing module 14 includes therein a plurality of coating units U1, a plurality of heat treatment units U2 and a transfer device A3 configured to transfer the wafer W to these units. The processing module 14 is configured to perform a developing processing of the exposed resist film R by the coating units U1 and the heat treatment units U2. Each of the coating units U1 of the processing module 14 performs the developing processing of the resist film R by coating the surface of the exposed wafer W with a developing solution and then washing it with a rinse liquid. The heat treatment units U2 of the processing module 14 perform various heat treatments required for performing the developing processing. Specific examples of the heat treatments may include a heat processing performed before the developing processing (PEB: Post Exposure Bake), a heat processing performed after the developing processing (PB: Post Bake), and the like.

Within the processing block 5, a shelf unit U10 is provided at a side of the carrier block 4. The shelf unit U10 is partitioned into a plurality of cells arranged in a vertical direction. A transfer device A7 including an elevation arm is provided near the shelf unit U10. The transfer device A7 is configured to move the wafer W up and down among the cells of the shelf unit U10.

Within the processing block 5, a shelf unit U11 is provided at a side of the interface block 6. The shelf unit U11 is partitioned into a plurality of cells arranged in the vertical direction.

The interface block 6 is configured to deliver the wafer W into/from the exposure apparatus 3. For example, the interface block 6 includes therein a transfer device A8 including a delivery arm, and is connected with the exposure apparatus 3. The transfer device A8 is configured to deliver the wafer W placed in the shelf unit U11 to the exposure apparatus 3, and receive the wafer W from the exposure apparatus 3 to return the received wafer W back into the shelf unit U11.

<Transfer Device>

Hereinafter, an example configuration of the transfer device A3 will be described in detail. As shown in FIG. 3, the transfer device A3 includes an arm 90, a driving member 91, a moving stage 92 and a driving member 93. The arm 90 horizontally supports the wafer W to be transferred.

The driving member 91 is configured to move the arm 90 back and forth along a direction (Y-axis direction) in which the plurality of coating units U1 is arranged. The driving member 91 includes, for example, a linear actuator configured to move the moving stage 92 along the Y-axis direction. The driving member 91 may include an electric motor (power source) configured to generate a rotational torque, and a timing belt that is stretched between a pair of pulleys. For example, the timing belt converts the rotational torque generated by the motor into a translational force along the Y-axis direction and transmits the translational force to the moving stage 92, and the moving stage 92 moves along the Y-axis direction.

The driving member 93 is provided on the moving stage 92 and moves together with the moving stage 92. The driving member 93 moves the arm 90 (allows the arm 90 to access) along a direction (X-axis direction) orthogonal to the direction in which the plurality of coating units U1 is arranged. The driving member 93 includes, for example, a linear actuator configured to move the arm 90 along the X-axis direction. The driving member 93 may include an electric motor (power source) configured to generate a rotational torque, and a timing belt that is stretched between a pair of pulleys. For example, the timing belt converts the rotational torque generated by the motor into a translational force along the X-axis direction and transmits the translational force to the arm 90, and the arm 90 moves along the X-axis direction. The driving member 93 moves the arm 90 back and forth between a standby position and an advanced position. The standby position is inside an area on the moving stage 92, and the advanced position is outside the area on the moving stage 92.

The driving members 91 and 93 separately operate based on operation instructions from the control device 100. For example, as the operation instruction, a signal indicating a stroke amount of the arm 90 is sent to the driving members 91 and 93. The stroke amount of the arm 90 in the Y-axis direction is a movement distance of the arm 90 from a reference position which is an end portion of the driving member 91 close to the shelf unit U10. The stroke amount of the arm 90 in the X-axis direction is a movement distance of the arm 90 from the standby position to the advanced position. Each of the driving members 91 and 93 may have an encoder configured to output a pulse signal depending on the rotation amount of the motor from a predetermined position to the control device 100. For example, the control device 100 outputs the operation instruction to the driving members 91 and 93 so that a count value of the pulse signal becomes a preset target value (hereinafter, referred to as "pulse target value").

<Coating Unit>

Figure 4:
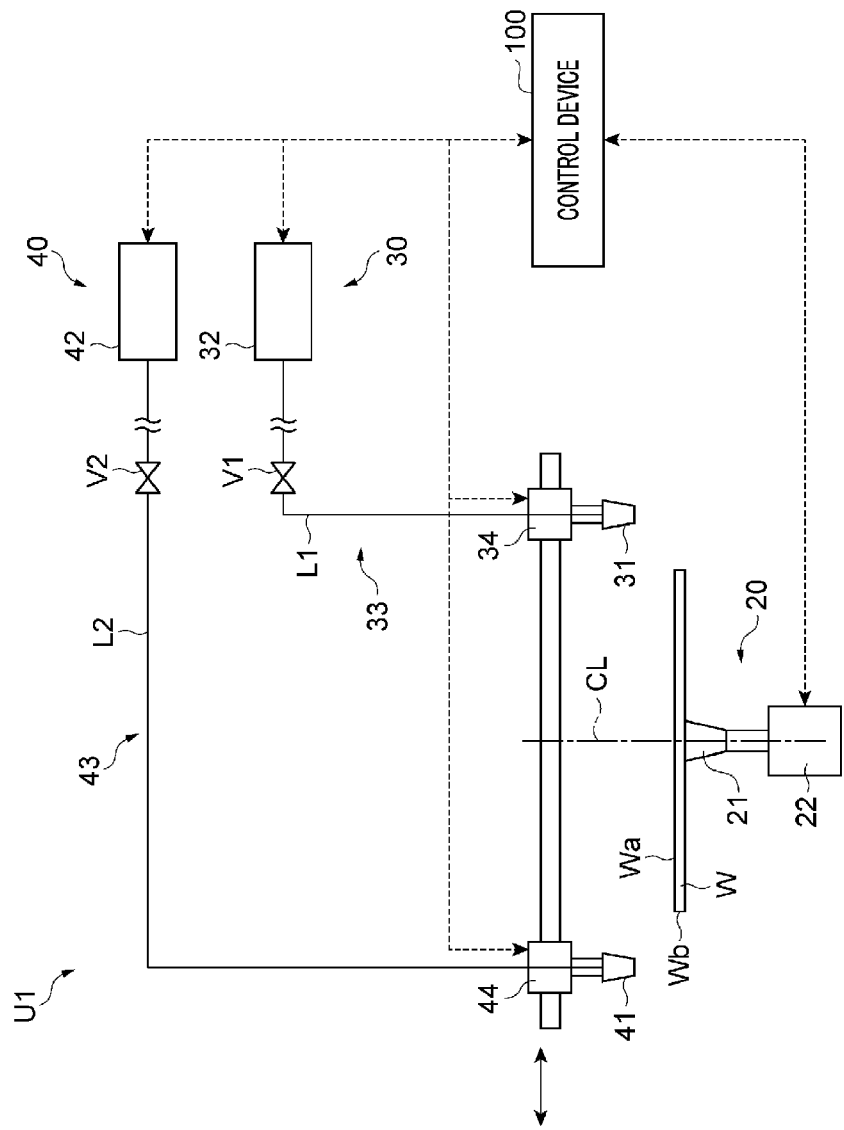
FIG. 4 is a schematic diagram illustrating an example configuration of a coating unit.

Hereinafter, an example configuration of the coating unit U1 of the processing module 12 will be described in detail. The coating unit U1 forms a resist coating film by supplying the processing liquid for forming the resist film to the surface Wa of the wafer W. Also, the coating unit U1 forms a resist coating film, from which a peripheral portion has been removed, by supplying a chemical liquid for removing the resist coating film to a peripheral portion of the resist coating film. The coating unit U1 may peel the resist coating film from the wafer W by supplying a chemical liquid for removing the resist coating film remaining after the peripheral portion has been removed to the surface Wa of the wafer W. In the present disclosure, the term "peeling" means to remove almost all of the resist coating film remaining on the surface Wa of the wafer W. As shown in FIG. 4, the coating unit U1 has a rotation holder 20, a processing liquid supply 30 and a chemical liquid supply 40.

The rotation holder 20 is configured to hold and rotate the wafer W. For example, the rotation holder 20 has a holder 21 and a rotation driving unit 22. The holder 21 supports a central portion of the horizontally disposed wafer W with the surface Wa facing upwards, and holds the wafer W by attraction (for example, vacuum attraction). The rotation driving unit 22 rotates the holder 21 about its vertical central axis CL by using, for example, an electric motor as a power source. Thus, the wafer W is rotated.

The processing liquid supply 30 is configured to supply a processing liquid for forming the resist film to the surface Wa of the wafer W. For example, the processing liquid supply 30 has a nozzle 31, a liquid source 32, a liquid feeding unit 33 and a nozzle moving unit 34. The nozzle 31 is configured to discharge the processing liquid toward the surface Wa of the wafer W. The liquid source 32 contains the processing liquid and force-feeds the processing liquid to the nozzle 31. The liquid feeding unit 33 guides the processing liquid from the liquid source 32 to the nozzle 31. For example, the liquid feeding unit 33 has a liquid feeding line L1 and a valve V1. The liquid feeding line L1 connects the liquid source 32 and the nozzle 31. The valve V1 is, for example, an air operation valve, and opens/closes a flow path within the liquid feeding line L1. The nozzle moving unit 34 moves the nozzle 31 in a horizontal direction by using an electric motor or the like as a power source. For example, the nozzle moving unit 34 moves the nozzle 31 between the central axis CL and an area outside the wafer W. The valve V1 and the nozzle moving unit 34 operate based on operation instructions from the control device 100.

The chemical liquid supply 40 is configured to supply a chemical liquid for removing the resist coating film to the surface Wa of the wafer W. The chemical liquid is a solvent capable of removing (dissolving) the resist coating film formed with the processing liquid supplied from the processing liquid supply 30. Specific examples of the chemical liquid may include organic solvents such as a thinner. For example, the chemical liquid supply 40 has a nozzle 41, a liquid source 42, a liquid feeding unit 43 and a nozzle moving unit 44. The nozzle 41 is configured to discharge a chemical liquid toward the surface Wa of the wafer W being rotated by the rotation holder 20. The liquid source 42 contains the chemical liquid and force-feeds the chemical liquid toward the nozzle 41. The liquid feeding unit 43 guides the chemical liquid from the liquid source 42 to the nozzle 41. For example, the liquid feeding unit 43 has a liquid feeding line L2 and a valve V2. The liquid feeding line L2 connects the liquid source 42 and the nozzle 41. The valve V2 is, for example, an air operation valve, and opens/closes a flow path within the liquid feeding line L2. The valve V2 operates based on operation instructions from the control device 100.

The nozzle moving unit 44 moves the nozzle 41 in the horizontal direction by using an electric motor or the like as a power source. For example, the nozzle moving unit 44 moves the nozzle 41 along a radial direction (for example, the Y-axis direction) of the wafer W held substantially horizontally when viewed from above. Since the nozzle 41 is moved by the nozzle moving unit 44 along the radial direction of the wafer W, a supply position of the chemical liquid from the nozzle 41 to the surface Wa is changed. Therefore, the cut width of the peripheral portion of the resist coating film to be removed by the chemical liquid discharged from the nozzle 41 varies depending on an arrangement position of the nozzle 41. The nozzle moving unit 44 operates based on operation instructions from the control device 100. The nozzle moving unit 44 may have an encoder that outputs a pulse signal depending on the rotation amount of the motor from a predetermined position to the control device 100. For example, the control device 100 outputs an operation instruction to the nozzle moving unit 44 so that a count value of the pulse signal becomes a preset target value (pulse target value).

Further, the chemical liquid supply 40 may have a nozzle configured to discharge a chemical liquid for removing the peripheral portion of the resist coating film and a nozzle configured to discharge a chemical liquid for peeling the resist coating film from which the peripheral portion has been removed. The chemical liquid for removing the peripheral portion and the chemical liquid for peeling the film may be different from each other. In this case, the chemical liquid supply 40 may have two liquid feeding units and two liquid sources that supply different chemical liquids to the nozzles, respectively.

<Inspection Unit>

Figure 5:
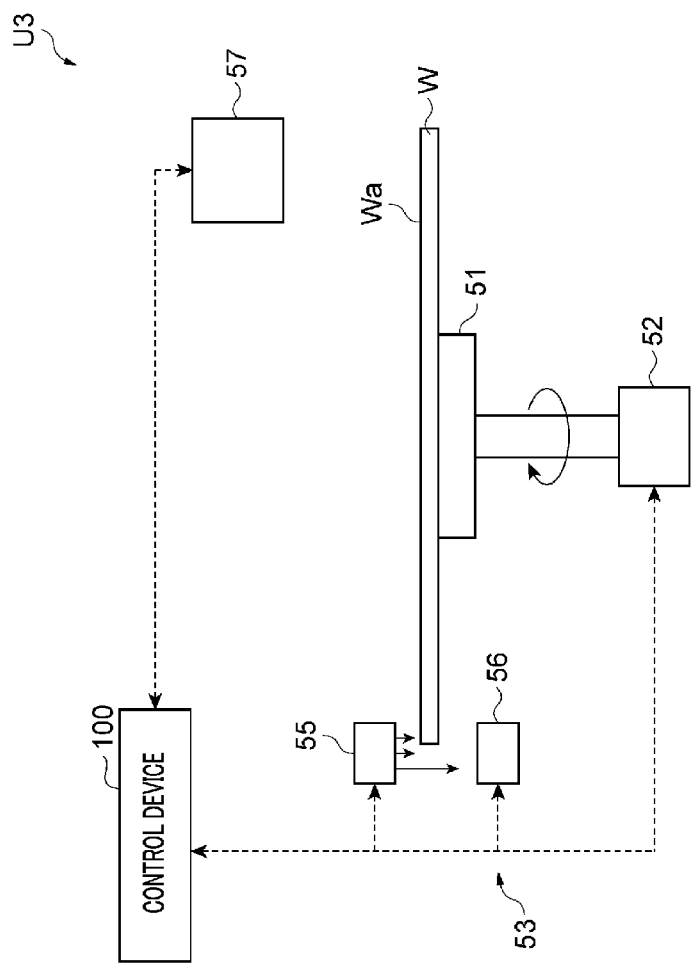
FIG. 5 is a schematic diagram illustrating an example configuration of an inspection unit.

Hereinafter, an example configuration of the inspection unit U3 will be described in detail. The inspection unit U3 is configured to acquire image data as surface information indicating the state of the surface Wa of the wafer W by imaging the surface Wa of the wafer W. Also, the inspection unit U3 uses the notch formed in the wafer W to adjust the orientation of the wafer W. As shown in FIG. 5, the inspection unit U3 has a holder 51, a rotation driving unit 52, a notch detector 53 and an imaging unit 57 (surface inspection unit).

The holder 51 supports the central portion of the horizontally disposed wafer W with the surface Wa facing upwards, and holds the wafer W by attraction (for example, vacuum attraction). The rotation driving unit 52 rotates the holder 51 about its vertical central axis by using, for example, an electric motor as a power source. Thus, the wafer W is rotated.

The notch detector 53 detects the notch of the wafer W. For example, the notch detector 53 has a light projecting member 55 and a light receiving member 56. The light projecting member 55 is configured to project light toward the peripheral portion of the wafer W being rotated. For example, the light projecting member 55 is disposed above the peripheral portion of the wafer W and to project the light downwards. The light receiving member 56 is configured to receive the light projected from the light projecting member 55. For example, the light receiving member 56 is disposed under the peripheral portion of the wafer W so as to face the light projecting member 55. The rotation driving unit 52, the light projecting member 55 and the light receiving member 56 operate based on operation instructions from the control device 100. The light receiving member 56 outputs light reception information indicating a result of light reception to the control device 100. Based on the light reception information, the control device 100 adjusts the notch to have a predetermined orientation. That is, the orientation of the wafer W is adjusted.

The imaging unit 57 is a camera configured to image at least the peripheral portion of the surface Wa of the wafer W. For example, when the resist coating film from which the peripheral portion has been removed is formed on the surface Wa of the wafer W, the imaging unit 57 images the surface Wa of the wafer W in an image capture range including an outer edge of the resist coating film and an outer edge of the wafer W. The imaging unit 57 is disposed above the wafer W held on the holder 51. The imaging unit 57 operates based on operation instructions from the control device 100 and outputs the acquired image data to the control device 100. Based on the image data, the control device 100 inspects the state of the surface Wa of the wafer W.

<Control Device>

Hereinafter, an example of the control device 100 will be described in detail. The control device 100 controls each component included in the coating/developing apparatus 2. The control device 100 is configured to perform a process processing (production processing) including forming the resist coating film on the surface Wa of the wafer W by the coating unit U1 and removing the peripheral portion of the resist coating film by the predetermined cut width by the coating unit U1. Also, the control device 100 is configured to perform the adjustment processing for adjusting the cut width by setting operation conditions of devices that affect the cut width of the peripheral portion of the resist coating film in the process processing. Details of the process processing and the adjustment processing will be described later.

Figure 6:
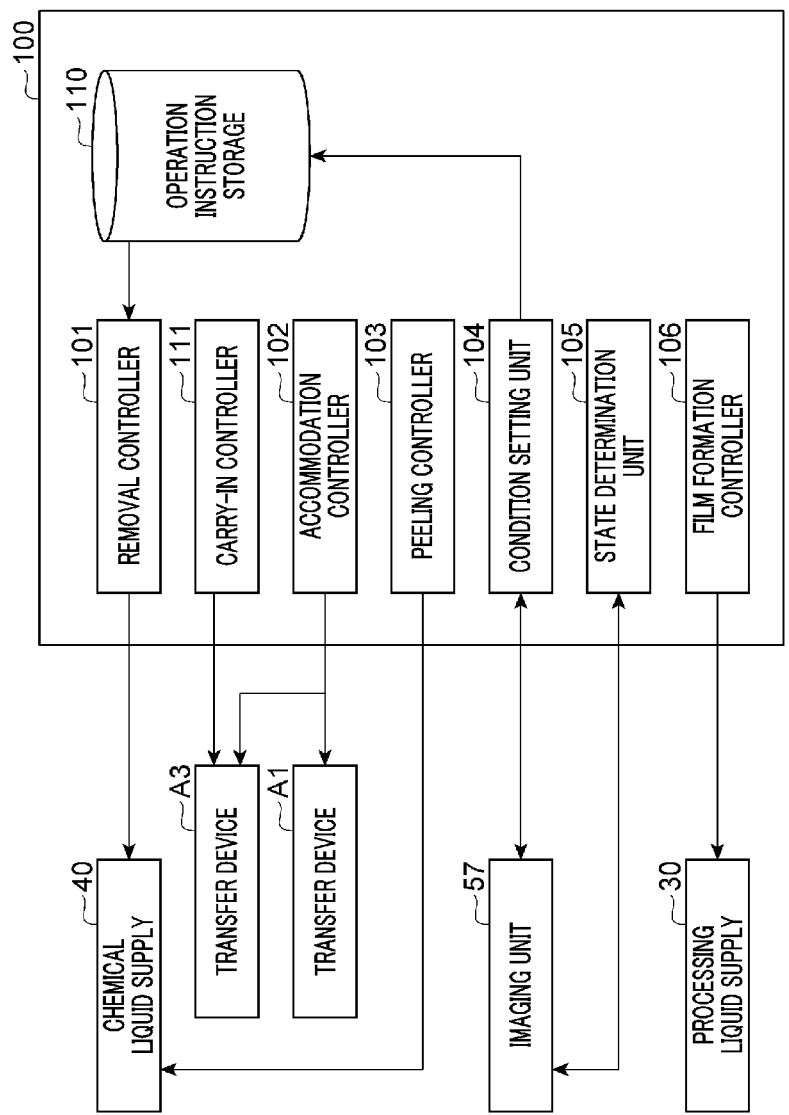
FIG. 6 is a block diagram illustrating a functional configuration of a control device.

As shown in FIG. 6, the control device 100 includes, as functional components, an operation instruction storage 110, a removal controller 101, a carry-in controller 111, an accommodation controller 102, a peeling controller 103, a condition setting unit 104, a state determination unit 105 and a film formation controller 106.

The operation instruction storage 110 stores information about the cut width of the peripheral portion of the resist coating film (hereinafter, referred to "holding information"). The holding information may include setting information (operation condition) about an operation of the device that affects the cut width and various conditions for performing the adjustment processing which have been previously input by the operator or another device. For example, the setting information includes a holding position of the wafer W held on the rotation holder 20 and an arrangement position of the nozzle 41 at the time of removing the peripheral portion. The holding position of the wafer W held on the rotation holder 20 may be determined by the stroke amount of the arm 90 in the X-axis direction and the Y-axis direction. The conditions for performing the adjustment processing include, for example, a target value of the cut width, an upper limit of the repetition number and limits of the setting information.

The removal controller 101 is configured to remove the peripheral portion of the resist coating film by the coating unit U1. Specifically, the removal controller 101 controls the nozzle moving unit 44 to place the nozzle 41 at the arrangement position based on information indicating the arrangement position of the nozzle 41 and stored in the operation instruction storage 110. Also, the removal controller 101 controls the chemical liquid supply 40 to discharge the chemical liquid for removing the peripheral portion of the resist coating film from the nozzle 41 placed at the arrangement position.

The carry-in controller 111 is configured to place the wafer W, on which the resist coating film has not been formed, at a predetermined position on the rotation holder 20 by the transfer device A3. For example, the carry-in controller 111 controls the transfer device A3 to carry the wafer W into the coating unit U1 and place the wafer W at the holding position on the rotation holder 20 based on information indicating the holding position of the wafer W on the rotation holder 20 and stored in the operation instruction storage 110. The carry-in controller 111 may control the transfer device A3 to move the arm 90 by the stroke amount (pulse target value) according to the information indicating the holding position.

The accommodation controller 102 is configured to carry the wafer W to be used for the adjustment processing out of the carrier C (carrier C accommodating therein the wafer W on which the resist coating film has not been formed) by the transfer device A1 and carry the wafer W, from which the resist coating film has been peeled off, into the carrier C by the transfer devices A1 and A3 (transfer unit) in the adjustment processing.

The peeling controller 103 is configured to peel the resist coating film, from which the peripheral portion has been removed, by the coating unit U1. For example, the peeling controller 103 controls the nozzle moving unit 44 to place the nozzle 41 on the central axis CL of the wafer W held on the rotation holder 20. Also, the peeling controller 103 controls the chemical liquid supply 40 to discharge the chemical liquid for peeling the resist coating film from the nozzle 41 placed on the central axis CL.

The condition setting unit 104 is configured to acquire surface information indicating the state of the surface Wa of the wafer W including the resist coating film, from which the peripheral portion has been removed, by the imaging unit 57 and configured to adjust the cut width of the peripheral portion based on the surface information. For example, the condition setting unit 104 images the entire circumference or a part of the circumference of the wafer W by the imaging unit 57 in the image capture range including the outer edge of the resist coating film, from which the peripheral portion has been removed, and the outer edge of the wafer W to acquire the image data indicating the state of the surface Wa of the wafer W including the resist coating film by the imaging unit 57. Also, the condition setting unit 104 measures the cut width of the peripheral portion from the image data, and adjusts (corrects) the operation conditions of the device that affect the cut width based on the measurement value of the cut width to adjust the cut width of the peripheral portion.

The state determination unit 105 is configured to acquire image data as surface information indicating the state of the surface Wa of the wafer W, on which the resist coating film has not been formed, by the imaging unit 57 and configured to determine whether the wafer W is available for adjusting the cut width based on the image data. For example, the state determination unit 105 images the surface Wa of the wafer W by the imaging unit 57 in an image capture range including the entire surface Wa of the wafer W, on which the coating film AF has not been formed, to acquire image data indicating the state of the entire surface Wa of the wafer W by the imaging unit 57. Also, the state determination unit 105 determines whether the film (for example, the resist coating film) remains on the surface Wa of the wafer W based on the image data. For example, if it is determined that more than a predetermined amount of the resist coating film remains on the surface Wa of the wafer W, the state determination unit 105 determines that the wafer W cannot be used for adjusting the cut width.

The film formation controller 106 is configured to form the resist coating film on the surface Wa of the wafer W by the coating unit U1. Specifically, the film formation controller 106 controls the nozzle moving unit 34 to place the nozzle 31 on the central axis CL of the wafer W held on the rotation holder 20. Also, the film formation controller 106 controls the processing liquid supply 30 to discharge the processing liquid for forming the resist film from the nozzle 31 placed on the central axis CL.

Figure 7:
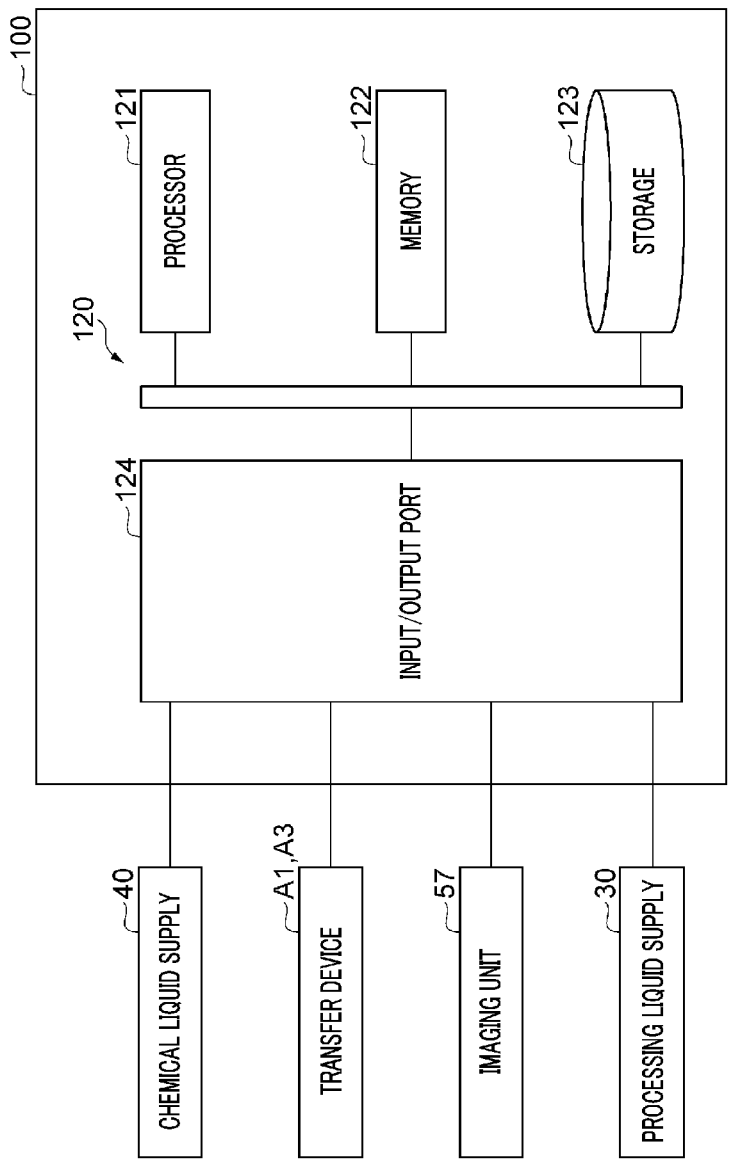
FIG. 7 is a block diagram illustrating a hardware configuration of the control device.

The control device 100 is composed of one or more control computers. For example, the control device 100 includes a circuit 120 shown in FIG. 7. The circuit 120 includes one or more processors 121, a memory 122, a storage 123 and an input/output port 124. The storage 123 has a computer-readable recording medium such as a hard disk. The recording medium stores programs for executing a process processing sequence and an adjustment processing sequence to be described later by the control device 100. The recording medium may be a portable medium such as a non-volatile semiconductor memory, a magnetic disk or an optical disk. The memory 122 temporarily stores thereon the programs loaded from the recording medium of the storage 123 and operation results by the processors 121. The processors 121 constitute the above-described individual functional modules by executing the programs in cooperation with the memory 122. The input/output port 124 is configured to perform an input and an output of electric signals with respect to a control target member in response to instructions from the processors 121.

The hardware configuration of the control device 100 is not necessarily limited to constituting the individual functional modules by the programs. For example, the individual functional modules of the control device 100 may be composed of exclusive logical circuits or an ASIC (Application Specific Integrated Circuit) in which these logical circuits are integrated.

<Process Processing Sequence>

Hereinafter, a process processing sequence performed in the coating/developing apparatus 2 will be described as an example of a coating/developing processing. This process processing sequence includes forming the resist coating film on the surface Wa of the wafer W by the coating unit U1 (the processing liquid supply 30) and removing the peripheral portion of the resist coating film by the cut width of the peripheral portion of the resist coating film, which has been adjusted in the adjustment processing sequence, by the coating unit U1 (the chemical liquid supply 40).

According to the process processing sequence, the control device 100 first controls the transfer device A1 to transfer the wafer W, serving as a processing target, in the carrier C to the shelf unit U10 and controls the transfer device A7 to place the wafer W in the cell for the processing module 11.

Then, the control device 100 controls the transfer device A3 to transfer the wafer W in the shelf unit U10 to the coating unit U1 and the heat treatment unit U2 within the processing module 11. Also, the control device 100 controls the coating unit U1 and the heat treatment unit U2 to form the base film on the surface of the wafer W. Thereafter, the control device 100 controls the transfer device A3 to return the wafer W, on which the base film has been formed, back to the shelf unit U10 and controls the transfer device A7 to place the wafer W in the cell for the processing module 12.

Then, the control device 100 controls the transfer device A3 to transfer the wafer W in the shelf unit U10 to the coating unit U1 and the heat treatment unit U2 within the processing module 12. Also, the control device 100 controls the coating unit U1 and the heat treatment unit U2 to form the resist film R on the base film of the wafer W. For example, the control device 100 controls the coating unit U1 to form the resist coating film (coating film AF) by coating the processing liquid for forming the resist film on the base film of the wafer W. Then, the control device 100 controls the coating unit U1 to remove the peripheral portion of the resist coating film by coating the chemical liquid on the peripheral portion of the resist coating film on the wafer W.

Then, the control device 100 controls the heat treatment unit U2 to perform the heating treatment on the resist coating film (coating film RF). Thereafter, the control device 100 controls the transfer device A3 to return the wafer W back to the shelf unit U10 and controls the transfer device A7 to place the wafer W in the cell for the processing module 13. Also, after the resist film R is formed, the control device 100 may control the transfer device A3 to transfer the wafer W to the inspection unit U3, and may inspect the state of the surface of the wafer W (for example, cut width) by the inspection unit U3.

Then, the control device 100 controls the transfer device A3 to transfer the wafer W in the shelf unit U10 to each unit within the processing module 13 and also controls the coating unit U1 and the heat treatment unit U2 to form the upper film on the resist film R of the wafer W. Thereafter, the control device 100 controls the transfer device A3 to transfer the wafer W to the shelf unit U11.

Then, the control device 100 controls the transfer device A8 to transfer the wafer W in the shelf unit U11 to the exposure apparatus 3. Thereafter, the control device 100 receives the wafer W, to which the exposure processing has been performed, from the exposure apparatus 3 and controls the transfer device A8 to place the wafer W in the cell for the processing module 14 in the shelf unit U11.

Then, the control device 100 controls the transfer device A3 to transfer the wafer W in the shelf unit U11 to each unit within the processing module 14 and also controls the coating unit U1 and the heat treatment unit U2 to perform the developing processing on the resist film R of the wafer W. Thereafter, the control device 100 controls the transfer device A3 to return the wafer W back to the shelf unit U10 and controls the transfer device A7 and the transfer device A1 to return the wafer W back into the carrier C. Thus, the process processing is completed.

<Adjustment Processing Sequence>

Hereinafter, an adjustment processing sequence for adjusting the cut width of the peripheral portion of the resist coating film in the process processing will be described. This adjustment processing sequence includes forming the resist coating film on the surface Wa of the wafer W by the coating unit U1 (the processing liquid supply 30) and removing the peripheral portion of the resist coating film by the coating unit U1 (the chemical liquid supply 40). This adjustment processing sequence includes acquiring the surface information indicating the state of the surface Wa of the wafer W including the resist coating film, from which the peripheral portion has been removed, by the imaging unit 57, adjusting the cut width of the peripheral portion based on the surface information, and peeling the resist coating film, from which the peripheral portion has been removed, by the coating unit U1 (the chemical liquid supply 40).

Hereinafter, for simple description, a series of adjustment processing sequence will be described as being performed in one of the plurality of coating units U1 of the processing module 12. Also, the coating unit U1 will be referred to as "coating unit U1 for adjustment target". Further, for the convenience of description, it is assumed that the same wafer W is used in the series of adjustment processing sequence, and the wafer W will be referred to as "wafer W for adjustment processing".

Figure 8:
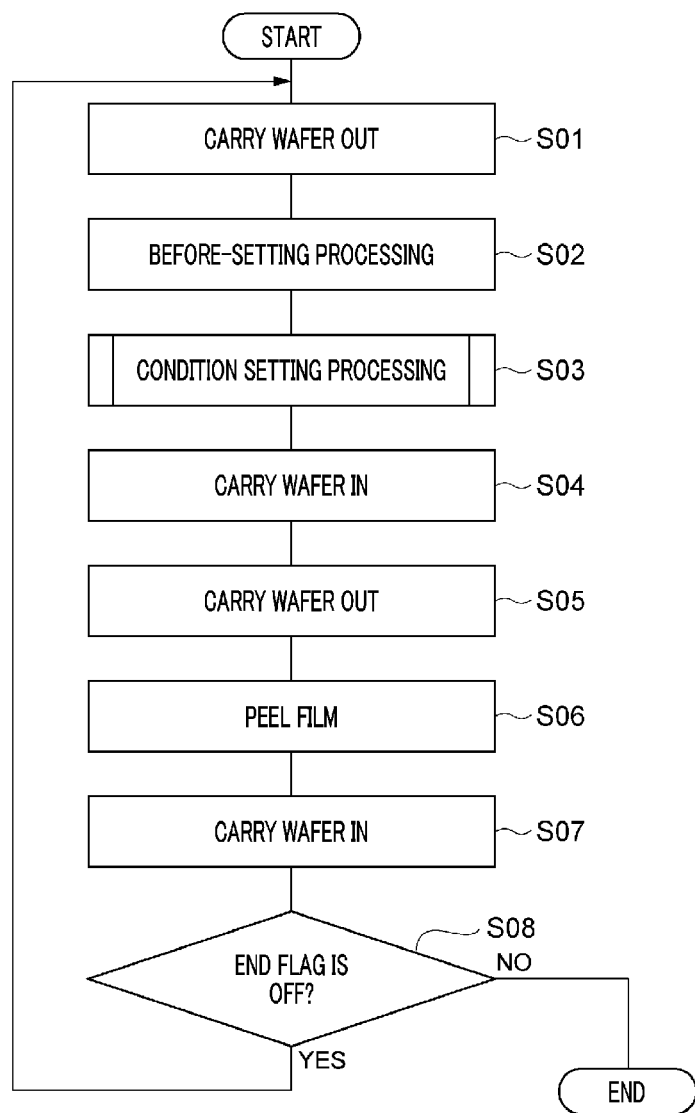
FIG. 8 is a flowchart illustrating an example adjustment processing sequence.

As shown in FIG. 8, the control device 100 first performs a process S01. In the process S01, the accommodation controller 102 controls the transfer device A1 to carry the wafer W for adjustment processing out of the carrier C. Then, the accommodation controller 102 controls the transfer device A1 to place the carried-out wafer W for adjustment processing in the cell for the processing module 12 in the shelf unit U10. Thereafter, the accommodation controller 102 controls the transfer device A3 to transfer the wafer W for adjustment processing in the shelf unit U10 to the inspection unit U3.

Then, the control device 100 performs a process S02. In the process S02, the control device 100 performs a before-setting processing. In the before-setting processing, the control device 100 first controls the inspection unit U3 to adjust the wafer W for adjustment processing to have a predetermined orientation. Specifically, the control device 100 controls the rotation driving unit 52 based on the light reception information from the light receiving member 56 to adjust the notch formed in the wafer W for adjustment processing to have the predetermined orientation. Thus, the notch in the wafer W may have the predetermined orientation (for example, negative X-axis direction).

Then, in the before-setting processing, the state determination unit 105 images the surface Wa of the wafer W for adjustment processing, on which the resist coating film has not been formed, by the imaging unit 57 to acquire the image data indicating the state of the surface Wa by the imaging unit 57. The state determination unit 105 determines whether the wafer W for adjustment processing is available for adjusting the cut width based on the image data. For example, if it is determined that more than a predetermined amount of the resist film remains on the surface Wa of the wafer W for adjustment processing, the state determination unit 105 determines that the wafer W for adjustment processing cannot be used for adjusting the cut width. If it is determined that the wafer W for adjustment processing cannot be used for adjusting the cut width, the control device 100 may stop performing the adjustment processing and then perform an adjustment processing to another wafer from the start.

If it is determined that the wafer W for adjustment processing is available for adjusting the cut width, the control device 100 performs a process S03. In the process S03, the condition setting unit 104 performs a condition setting processing. In the condition setting processing, the condition setting unit 104 forms a resist coating film for testing on the wafer W for adjustment processing, removes a peripheral portion of the corresponding resist coating film and then adjusts the operation conditions of the device that affect the cut width. Details of the condition setting processing of the process S03 will be described later.

Then, the control device 100 performs a process S04. In the process S04, for example, the accommodation controller 102 controls the transfer devices A3 and A1 to carry the wafer W for adjustment processing, to which the condition setting processing has been performed, into the carrier C.

Then, the control device 100 performs a process S05. In the process S05, for example, the accommodation controller 102 controls the transfer device A1 to carry the wafer W for adjustment processing out of the carrier C and place the wafer W for adjustment processing in the cell for the processing module 12 in the shelf unit U10. Also, the control device 100 controls the transfer device A3 to transfer the wafer W for adjustment processing placed in the shelf unit U10 to the coating unit U1 for adjustment target.

Figure 11A:
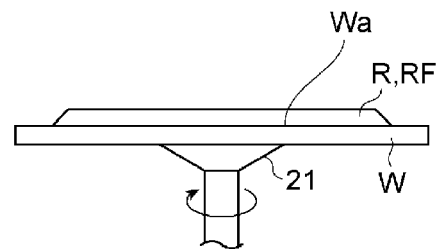
FIG. 11A to FIG. 11C are explanatory diagrams illustrating a surface of a substrate in the adjustment processing sequence.
Figure 11B:
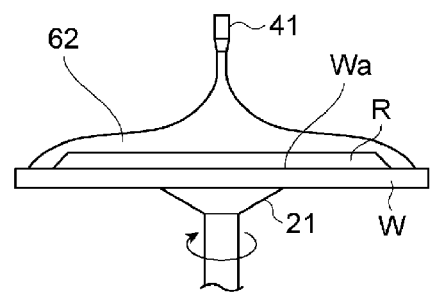
Figure 11C:
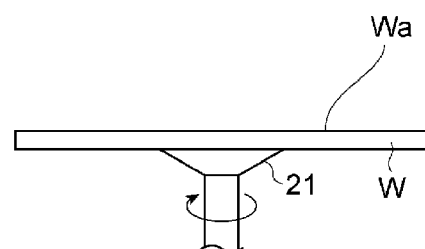

Then, the control device 100 performs a process S06. In the process S06, the peeling controller 103 controls the chemical liquid supply 40 of the coating unit U1 for adjustment target to peel the resist film remaining on the surface Wa of the wafer W for adjustment processing. Also, when the condition setting processing in the process S03 is ended, the resist coating film (resist film R) remains on the surface Wa of the wafer W for adjustment processing as shown in FIG. 11A. In the process S06, specifically as shown in FIG. 11B, the peeling controller 103 controls the nozzle moving unit 44 to place the nozzle 41 of the chemical liquid supply 40 on the central axis CL of the wafer W for adjustment processing held on the rotation holder 20. Then, the peeling controller 103 controls the valve V1 of the chemical liquid supply 40 to discharge a chemical liquid 62 for peeling the resist coating film from the nozzle 41 placed on the central axis CL. Also, to rotate the wafer W for adjustment processing while the chemical liquid 62 is discharged, the control device 100 may control the rotation driving unit 22 of the rotation holder 20. Thus, as shown in FIG. 11C, the resist coating film is peeled off from the surface Wa of the wafer W for adjustment processing.

Thereafter, the control device 100 performs a process S07. In the process S07, the accommodation controller 102 controls the transfer devices A1 and A3 to carry the wafer W for adjustment processing, to which the peeling of the resist coating film has been performed, into the carrier C.

Then, the control device 100 performs a process S08. In the process S08, the control device 100 determines whether an end flag is OFF. The end flag is a flag for determining whether or not to end the adjustment processing and is set in the condition setting processing of the process S03. Also, the end flag is previously set to be OFF before the adjustment processing is performed.

If it is determined in the process S08 that the end flag is OFF (process S08: YES), the control device 100 repeats the processes S01 to S08. If it is determined in the process S08 that the end flag is ON (process S08: NO), the control device 100 ends the adjustment processing sequence. The control device 100 repeats the adjustment processing sequence until it is determined that the end flag is ON. As described above, in this example, the same wafer W for adjustment processing is used for the adjustment processing. Therefore, the control device 100 allows the coating unit U1 for adjustment target to repeatedly perform the adjustment processing using the same wafer W for adjustment processing. After the adjustment processing is performed by the coating unit U1 for adjustment target, the control device 100 may sequentially allow other coating units of the plurality of coating units U1 to perform the adjustment processing. The control device 100 may perform the process processing after these adjustment processings are completed.

<Condition Setting Processing>

Figure 9:
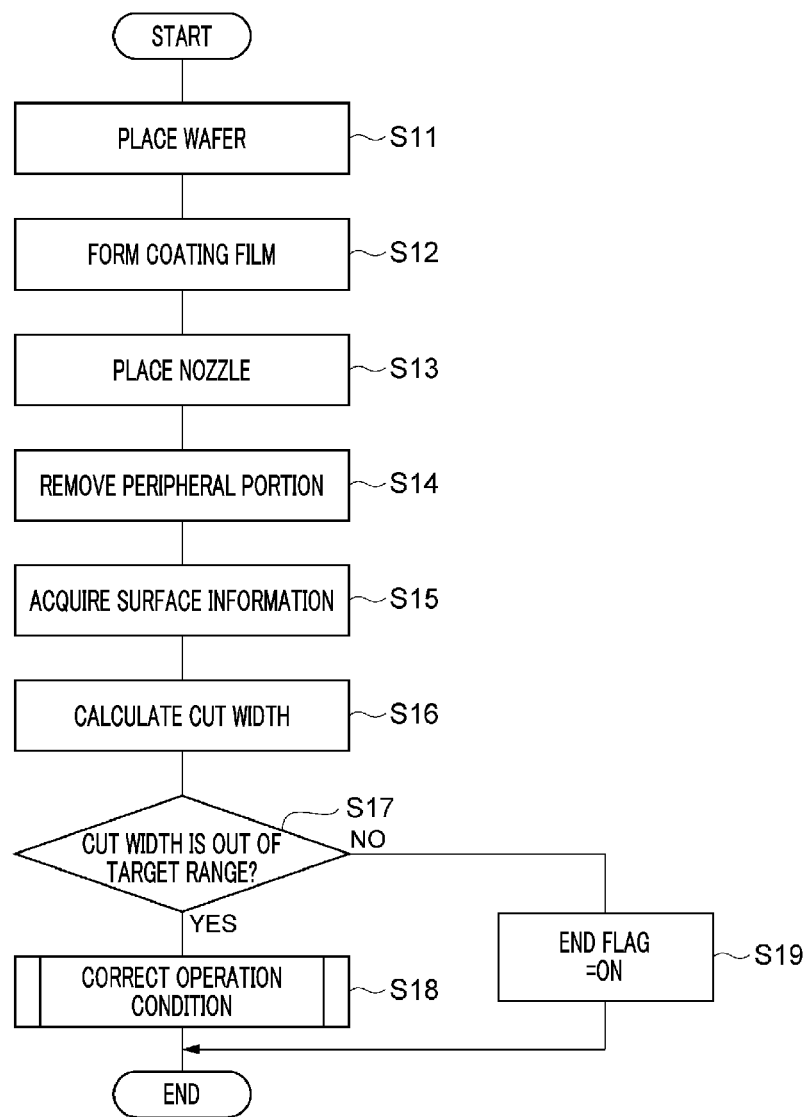
FIG. 9 is a flowchart illustrating an example condition setting processing sequence.

Hereinafter, the condition setting processing of the process S03 will be described. As shown in FIG. 9, in the condition setting processing, the control device 100 first performs a process S11. In the process S11, for example, the carry-in controller 111 controls the transfer device A3 to transfer the wafer W for adjustment processing from the inspection unit U3 to the coating unit U1 for adjustment target and place the wafer W for adjustment processing on the rotation holder 20. Here, the carry-in controller 111 controls the transfer device A3 to carry the wafer W into the coating unit U1 based on information (hereinafter, referred to as "holding position information") indicating the holding position of the wafer W on the rotation holder 20 and stored in the operation instruction storage 110 and place the wafer W at the holding position on the rotation holder 20. Here, with the notch having the orientation adjusted in the process S02, the carry-in controller 111 may control the transfer device A3 to transfer the wafer W for adjustment processing and place the wafer W for adjustment processing on the rotation holder 20. For example, since the stroke amount (pulse set value) of the arm 90 in the X-axis direction and the Y-axis direction is set based on the holding position information, the carry-in controller 111 may control the transfer device A3 to place the wafer W for adjustment processing at the holding position on the rotation holder 20.

Figure 12A:
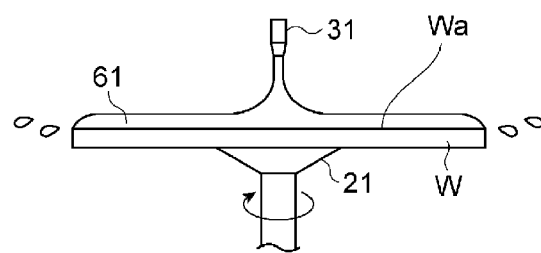
FIG. 12A to FIG. 12C are explanatory diagrams illustrating the surface of the substrate in the adjustment processing sequence.
Figure 12B:
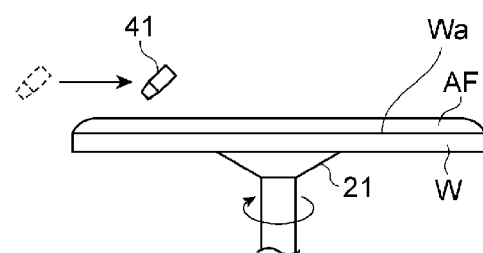

Then, the control device 100 performs a process S12. In the process S12, the film formation controller 106 controls the processing liquid supply 30 to form the resist coating film on the surface Wa of the wafer W for adjustment processing. Specifically, as shown in FIG. 12A, the film formation controller 106 controls the nozzle moving unit 34 to place the nozzle 31 of the processing liquid supply 30 on the central axis CL of the wafer W held on the rotation holder 20. Further, the film formation controller 106 controls the valve V1 of the processing liquid supply 30 to discharge a processing liquid 61 for forming the resist coating film from the nozzle 31 placed on the central axis CL. Also, to rotate the wafer W for adjustment processing while the processing liquid 61 is discharged, the control device 100 may control the rotation driving unit 22 of the rotation holder 20. Thus, as shown in FIG. 12B, the resist coating film (coating film AF) is formed on the surface Wa of the wafer W for adjustment processing.

Thereafter, the control device 100 performs a process S13. In the process S13, based on information (hereinafter, referred to as "arrangement position information") indicating the arrangement position of the nozzle 41 and stored in the operation instruction storage 110, the removal controller 101 controls the nozzle moving unit 44 to place the nozzle 41 at the arrangement position. For example, by setting the pulse target value for the nozzle moving unit 44 based on the arrangement position information, the removal controller 101 may control the nozzle moving unit 44 to place the nozzle 41 at the arrangement position.

Figure 12C:
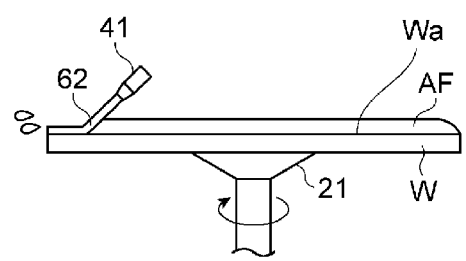

Then, the control device 100 performs a process S14. In the process S14, as shown in FIG. 12C, the removal controller 101 controls the valve V2 of the chemical liquid supply 40 to discharge the chemical liquid 62 for removing the resist coating film from the nozzle 41 placed at the arrangement position. Also, to rotate the wafer W for adjustment processing while the chemical liquid 62 is discharged, the control device 100 may control the rotation driving unit 22. Thus, as shown in FIG. 11A, the peripheral portion of the resist coating film on the surface Wa of the wafer W for adjustment processing is removed. Further, the control device 100 controls the transfer device A3 to transfer the wafer W for adjustment processing including the resist coating film (coating film RF), from which the peripheral portion has been removed, to any one of the heat treatment units U2 within the processing module 12 and controls the corresponding heat treatment unit U2 to perform the heat treatment to the resist coating film. Thus, a resist film R for testing is formed on the surface Wa of the wafer W for adjustment processing. Then, the control device 100 controls the transfer device A3 to transfer the wafer W for adjustment processing to the inspection unit U3.

Figure 13:
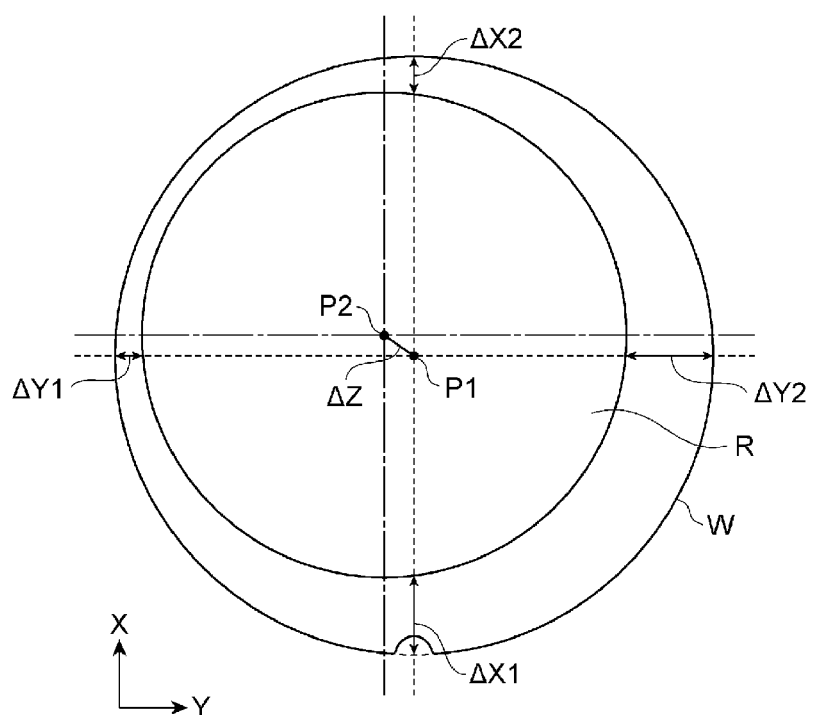
FIG. 13 is an explanatory diagram for explaining a cut width calculated in the adjustment processing sequence.

Thereafter, the control device 100 performs processes S15 and S16. In the process S15, the condition setting unit 104 controls the imaging unit 57 to acquire image data indicating the state of the surface Wa of the wafer W for adjustment processing after the resist coating film is formed. In the process S16, the condition setting unit 104 calculates the cut width of the removed peripheral portion based on the image data. For example, the condition setting unit 104 may calculate cut widths $\Delta X1$, $\Delta X2$, $\Delta Y1$ and $\Delta Y2$ at four angles 90° apart from each other along the circumferential direction about a center P1 of the wafer W as shown in FIG. 13, based on the image data. For example, the condition setting unit 104 may calculate the cut width at the position where the notch is formed as the cut width $\Delta X1$.

The condition setting unit 104 may calculate the average of the cut widths $\Delta X1$, $\Delta X2$, $\Delta Y1$ and $\Delta Y2$ as an average cut width $\Delta A$. Also, the condition setting unit 104 may calculate a difference between the cut width $\Delta X1$ and the cut width $\Delta X2$ as an eccentricity value $\Delta X$ in the X-axis direction and may calculate a difference between the cut width $\Delta Y1$ and the cut width $\Delta Y2$ as an eccentricity value $\Delta Y$ in the Y-axis direction. Further, the eccentricity values $\Delta X$ and $\Delta Y$ indicate the degree of deviation (deviation amount $\Delta Z$) between the center P1 of the wafer W and a center P2 of the resist film R. The eccentricity values $\Delta X$ and $\Delta Y$ vary depending on the holding position of the wafer W on the rotation holder 20 when the periphery is removed.

Then, the control device 100 performs a process S17. In the process S17, the condition setting unit 104 determines whether the cut width (hereinafter, referred to as "calculated cut width") calculated in the process S16 is out of a predetermined target range. For example, the condition setting unit 104 acquires a difference (deviation) between the cut width calculated in the process S16 and a target value, which is an upper limit in the target range, and determines whether the difference reaches a predetermined level. For example, the condition setting unit 104 may determine whether the eccentricity values ΔX and ΔY are greater than a threshold value Th1, and whether a deviation δ between the average cut width ΔA and the target value is greater than a threshold value Th2. When any one of the conditions is satisfied, the condition setting unit 104 may determine that the calculated cut width is out of the target range.

If it is determined in the process S17 that the calculated cut width is out of the target range (process S17: YES), the control device 100 performs a process S18. In the process S18, the condition setting unit 104 performs correction of the operation conditions that affect the cut width in order for the cut width to be within the target range (to be close to the target value). A specific example of a correction sequence of the operation condition will be described later.

If it is determined in the process S17 that the calculated cut width is within the target range (process S17: NO), the control device 100 performs a process S19. In the process S19, the control device 100 sets the end flag to be ON. In the above-described example, when both the eccentricity values ΔX and ΔY are equal to or smaller than the threshold value Th1 and the deviation δ between the average cut width ΔA and the target value is equal to or smaller than the threshold value Th2, the control device 100 sets the end flag to be ON. Thus, the control device 100 ends the condition setting processing.

In the condition setting processing, when the calculated cut width is out of the target range in the process S17, the correction of the operation conditions is performed in the process S18 and the end flag is not ON. For this reason, the adjustment processing including the processes S01 to S08 is repeatedly performed. Whenever the adjustment processing is repeatedly performed, the correction of the operation conditions is performed in the process S18 to make the cut width close to the target value. In other words, the control device 100 repeatedly performs the adjustment processing until the difference between the cut width (calculated cut width) and the target value reaches a predetermined level.

<Correction Processing of Operation Condition>

Figure 10:
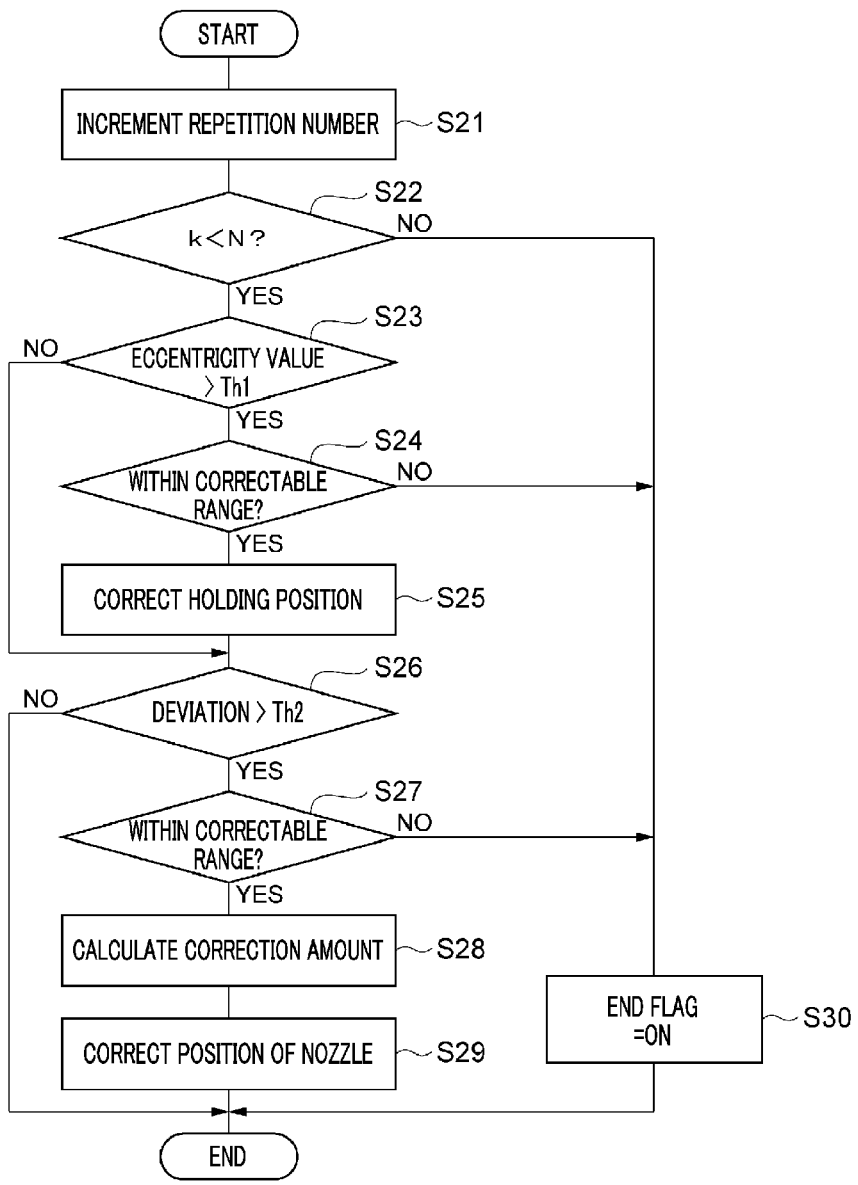
FIG. 10 is a flowchart illustrating an example correction sequence of an operation condition.

Hereinafter, a specific example of a correction processing of an operation condition in the process S18 will be described. FIG. 10 is a flowchart illustrating an example correction sequence of the operation condition performed when the eccentricity values ΔX and ΔY and the average cut width ΔA are calculated in the process S16.

According to the correction sequence of operation condition, the control device 100 first performs processes S21 and S22. In the process S21, the condition setting unit 104 increments a variable k that indicates the repetition number. In other words, the condition setting unit 104 adds 1 to the variable k. Also, before the adjustment processing is performed, the variable k is set to 0. In the process S22, the condition setting unit 104 determines whether the variable k is smaller than a predetermined constant N (for example, N is an integer of 3 or more). If it is determined in the process S22 that the variable k is equal to or greater than the constant N (process S22: NO), the control device 100 performs a process S30. The process S30 will be described later.

If it is determined in the process S22 that the variable k is smaller than the constant N (process S22: YES), the control device 100 performs a process S23. In the process S23, for example, the condition setting unit 104 determines whether any one of the eccentricity values ΔX and ΔY is greater than the threshold value Th1. If it is determined in the process S23 that any one of the eccentricity values ΔX and ΔY is greater than the threshold value Th1 (process S23: YES), the control device 100 performs processes S24 and S25. If it is determined in the process S23 that both the eccentricity values ΔX and ΔY are equal to or smaller than the threshold value Th1 (process S23: NO), the control device 100 does not perform the processes S24 and S25.

In the process S24, the condition setting unit 104 determines whether at least one of the eccentricity values ΔX or ΔY determined as greater than the threshold value Th1 is within a correctable range. For example, the correctable range of the eccentricity values ΔX and ΔY may be previously stored in the control device 100 (the operation instruction storage 110) by the operator (worker). If it is determined in the process S24 that any one of the eccentricity values ΔX and ΔY is not within the correctable range (process S24: NO), the control device 100 performs a process S30. If it is determined in the process S24 that the eccentricity values ΔX and ΔY are within the correctable range (process S24: YES), the control device 100 performs the process S25.

In the process S25, the condition setting unit 104 corrects the holding position information stored in the operation instruction storage 110 based on the eccentricity values ΔX and ΔY. For example, the condition setting unit 104 corrects the holding position information to make the eccentricity values ΔX and ΔY close to a target eccentricity value based on the eccentricity values ΔX and ΔY. The condition setting unit 104 may correct the holding position information by correcting the pulse target value for the motor provided in the driving members 91 and 93.

Then, the control device 100 performs a process S26. In the process S26, the condition setting unit 104 determines whether the deviation δ between the average cut width ΔA and the target value is greater than the threshold value Th2. If it is determined in the process S26 that the deviation δ is greater than the threshold value Th2 (process S26: YES), the control device 100 performs processes S27 to S29. If it is determined in the process S26 that the deviation δ is equal to or smaller than the threshold value Th2 (process S26: NO), the control device 100 does not perform the processes S27 to S29.

In the process S27, the condition setting unit 104 determines whether the deviation δ is within a correctable range. For example, the correctable range of the deviation δ may be previously stored in the control device 100 (the operation instruction storage 110) by the operator (worker). If it is determined in the process S27 that the deviation δ is not within the correctable range (process S27: NO), the control device 100 performs the process S30. If it is determined in the process S27 that the deviation δ is within the correctable range (process S27: YES), the control device 100 performs the process S28.

In the process S28, the condition setting unit 104 calculates a correction amount of the arrangement position information of the nozzle 41 based on the deviation δ. For example, the condition setting unit 104 calculates a correction amount so as to shift the arrangement position of the nozzle 41 by the same amount as a value obtained by reducing the target value to the average cut width ΔA. Then, in the process S29, the condition setting unit 104 corrects the arrangement position information stored in the operation instruction storage 110 using the correction amount calculated in the process S28. For example, the condition setting unit 104 may correct the arrangement position information of the nozzle 41 by correcting the pulse target value for the motor in the nozzle moving unit 44 according to the correction amount.

In the process S30, the condition setting unit 104 sets the end flag to be ON. In this case, the end flag turns to ON when the repetition number exceeds a set number or when the deviation $\delta$ is within an uncorrectable range, which shows an abnormal end unlike the process S19. Thus, the control device 100 ends the correction processing of the operation condition. By performing the correction processing of the operation condition as described above, the control device 100 adjusts the holding position of the wafer W for adjustment processing on the rotation holder 20 and the position of the nozzle 41 at the time of discharging the chemical liquid in the adjustment processing.

Also, in the condition setting processing and the correction processing of the operation condition, the control device 100 may not perform the calculation of the average cut width $\Delta A$ and the adjustment of the nozzle position (correction of the arrangement position information) at the time of discharging the chemical liquid, but may perform the calculation of the eccentricity values $\Delta X$ and $\Delta Y$ and the correction of the holding position information. Alternatively, the control device 100 may not perform the calculation of the eccentricity values $\Delta X$ and $\Delta Y$ and the correction of the holding position information, but may perform the calculation of the average cut width $\Delta A$ and the correction of the arrangement position information. In other words, the control device 100 (the condition setting unit 104) may adjust the cut width by adjusting any one of the holding position of the wafer W on the rotation holder 20 and the position of the nozzle 41 at the time of discharging the chemical liquid in the adjustment processing.

Effect of Exemplary Embodiment

The coating/developing apparatus 2 according to the present exemplary embodiment described above includes the processing module 12 (the processing liquid supply 30 and the chemical liquid supply 40) configured to form the resist coating film on the surface Wa of the wafer W and remove at least a part of the resist coating film; the imaging unit 57 configured to acquire the surface information indicating the state of the surface Wa of the wafer W; and the control device 100 configured to control the processing module 12 and the imaging unit 57. The control device 100 performs the adjustment processing including: forming the resist coating film on the surface Wa of the wafer W by the processing liquid supply 30; removing the peripheral portion of the resist coating film by the chemical liquid supply 40; acquiring the surface information indicating the state of the surface Wa of the wafer W including the resist coating film, from which the peripheral portion has been removed, by the imaging unit 57 and adjusting the cut width of the peripheral portion based on the surface information; and peeling the resist coating film, from which the peripheral portion has been removed, by the chemical liquid supply 40, and the process processing including: forming the resist coating film on the surface Wa of the wafer W by the processing liquid supply 30; and removing the peripheral portion by the cut width adjusted in the adjustment processing by the chemical liquid supply 40.

The substrate processing method according to the present exemplary embodiment includes performing the adjustment processing including: forming the resist coating film on the surface Wa of the wafer W by the processing module 12 (the processing liquid supply 30 and the chemical liquid supply 40) configured to form the film on the surface Wa of the wafer W and remove at least a part of the film; removing the peripheral portion of the resist coating film by the chemical liquid supply 40; adjusting the cut width of the peripheral portion based on the surface information indicating the state of the surface Wa of the wafer W including the resist coating film, from which the peripheral portion has been removed; and peeling the resist coating film, from which the peripheral portion has been removed, by the chemical liquid supply 40, and performing the process processing including: forming the resist coating film on the surface Wa of the wafer W by the processing liquid supply 30; and removing the peripheral portion by the cut width adjusted in the adjustment processing by the chemical liquid supply 40.

In the coating/developing apparatus 2 and in the substrate processing sequence, the resist coating film, from which the peripheral portion has been removed, is peeled off in the adjustment processing. For this reason, the wafer W from which almost all of the resist coating film has been removed is available for other processings, and, thus, the wafer W used for adjusting the cut width can be effectively used in the coating/developing apparatus 2 and in the substrate processing sequence.

In the above-described exemplary embodiment, the control device 100 repeatedly performs the adjustment processing until the deviation between the cut width and the target value reaches the predetermined level. When the adjustment processing is repeatedly performed, the wafer W for adjustment processing is required for each repetition. With the above-described configuration, the resist coating film on the wafer W is peeled off whenever the adjustment processing is performed, and, thus, the wafer W used for adjusting the cut width can be more effectively used.

In the above-described exemplary embodiment, the control device 100 repeatedly performs the adjustment processing using the same wafer W. Since the resist coating film on the wafer W is peeled off, the adjustment processing can be performed again using the corresponding wafer W. In the above-described configuration, the adjustment of the cut width is repeatedly performed using the same wafer W, and, thus, the influence of an individual difference between wafers W in adjusting the cut width is small. Therefore, the cut width can be adjusted with higher accuracy.

In the above-described exemplary embodiment, the coating/developing device 2 further includes the transfer devices A1 and A3 configured to transfer the wafer W. In the adjustment processing, the control device 100 carries the wafer W for adjustment processing out of the carrier C configured to accommodate therein the wafer W, on which the resist coating film has not been formed, by the transfer device A1 and carries the wafer W for adjustment processing, from which the resist coating film has been peeled off, into the carrier C by the transfer devices A1 and A3. In this case, the wafer W for adjustment processing is in a reusable state and accommodated in the carrier C, and, thus, the wafer W can be reused easily.

In the above-described exemplary embodiment, the coating/developing apparatus 2 further includes the rotation holder 20 configured to hold and rotate the wafer W. The processing liquid supply 30 and the chemical liquid supply 40 have the nozzle 41 for discharging the chemical liquid for removing the peripheral portion toward the wafer W being rotated by the rotation holder 20. In the adjusting processing, the control device 100 adjusts the cut width by adjusting at least one of the holding position of the wafer W on the rotation holder 20 and the position of the nozzle 41 at the time of discharging the chemical liquid. The holding position of the wafer W on the rotation holder 20 and the arrangement position of the nozzle 41 have a great influence on the cut width of the peripheral portion. Therefore, by adjusting at least one of the holding position and the arrangement position, the cut width can be adjusted with higher accuracy.

In the above-described exemplary embodiment, the control device 100 acquires the surface information indicating the state of the surface Wa of the wafer W, on which the resist coating film has not been formed, by the imaging unit 57, and determines whether the corresponding wafer W for adjustment processing is available for adjusting the cut width based on the corresponding surface information. Depending on the state of the surface Wa of the wafer W, the cut width may not be adjusted accurately. However, in the above-described configuration, it is determined whether the wafer W for adjustment processing can be used before the adjustment of the cut width is performed. Therefore, it is possible to adjust the cut width with higher accuracy.

While the present disclosure has been described with reference to the exemplary embodiments, the present disclosure is not limited to the exemplary embodiments but may be variously modified without departing from the spirit thereof.

Modification Example 1

While performing the process processing, the control device 100 may perform the adjustment processing in any one of the plurality of coating units U1 (for example, the coating unit U1 for adjustment target). Specifically, the control device 100 may perform at least a part of the adjustment processing in the coating unit U1 for adjustment target while performing the process processing in a plurality of coating units U1 except the coating unit U1 for adjustment target. Further, the control device 100 may perform a processing for performing a part of the adjustment processing while performing the process processing (hereinafter, referred to as "process and adjustment parallel processing") after the whole adjustment processing is completed and shifted to the process processing. Alternatively, after the adjustment processing is completed in some of the plurality of coating units U1, the control device 100 may perform the process and adjustment parallel processing such that the coating unit U11 in which the adjustment processing has been completed sequentially performs the process processing.

In the modification example 1, the processing module 12 has a plurality of coating units U1 configured to form a resist coating film and remove at least a part of the resist coating film. While performing the process processing in any one of the plurality of coating units U1, the control device 100 performs at least a part of the adjustment processing in another coating unit U1 of the plurality of coating units U1. In this case, since the adjustment processing is performed, the process processing can be performed without a stop.

Modification Example 2

While performing the adjustment processing in any one coating unit U1, the control device 100 may perform the adjustment processing in another coating unit U1. Specifically, while performing the adjustment processing in any one of the plurality of coating units U1 (for example, the coating unit U1 for adjustment target), the control device 100 may perform the adjustment processing in another coating unit U1. The control device 100 may perform a processing for performing the adjustment processing in the plurality of coating units U1 in parallel (hereinafter, referred to as "parallel adjustment processing") by using a plurality of wafers W for adjustment processing. The control device 100 may perform the adjustment processing in the process and adjustment parallel processing according to the modification example 1 in the same manner as the parallel adjustment processing according to the modification example 2.

In the modification example 2, the processing module 12 has a plurality of coating units U1 configured to form a resist coating film and remove at least a part of the resist coating film. While performing the adjustment processing in any one of the plurality of coating units U1, the control device 100 performs the adjustment processing in another coating unit U1 of the plurality of coating units U1. Since the adjustment processing is performed in the plurality of coating units in parallel, the adjustment processing can be completed in a short time. For this reason, it can be quickly shifted to the process processing.

Modification Example 3

The processing module 12 may have a coating unit U1 for adjustment target (first processing unit) configured to form a resist coating film and remove a peripheral portion; and a coating unit U1 configured to peel the resist coating film as another coating unit U1 (second processing unit) different from the coating unit U1 for adjustment target. In this case, the chemical liquid supply 40 of the coating unit U1 for adjustment target may or may not have the function to peel the resist coating film. The another coating unit U1 may not have the processing liquid supply 30, and the chemical liquid supply 40 of the coating unit U1 may not have the function to remove the peripheral portion. That is, the another coating unit U1 may be an exclusive unit configured to peel the resist coating film. In the adjustment processing for adjusting the cut width in the coating unit U1 for adjustment target, the control device 100 may peel the resist coating film by the another coating unit U1. Also, in the coating/developing apparatus 2 having the processing module 12 according to the modification example 3, the control device 100 may perform the process and adjustment parallel processing according to the modification example 1 or may perform the parallel adjustment processing according to the modification example 2.

In the modification example 3, the processing module 12 has the coating unit U1 for adjustment target configured to form a resist coating film and remove a peripheral portion and the another coating unit U1 configured to peel the resist coating film. In the adjustment processing for adjusting the cut width in the coating unit U1 for adjustment target, the control device 100 performs the peeling of the resist coating film, from which the peripheral portion has been removed, by the second processing unit. In this case, since the peeling of the resist coating film is performed in the another coating unit U1 in the adjustment processing, the processing can be performed in the coating unit U1 for adjustment processing without waiting for the peeling processing.

Other Modification Examples

The coating/developing apparatus 2 may be of any type as long as it has the film forming unit configured to form the resist coating film and remove the peripheral portion and the control device 100 capable of controlling the film forming unit. The film forming unit is not limited to the above-described configuration, and may have different units, for example, for forming the film, removing the peripheral portion thereof, and peeling the film, respectively. The inspection unit U3 may be located outside the processing module 12. For example, the inspection unit U3 may be placed in a part of the shelf unit U10 or the carrier block 4. The before-setting processing in the process S02 and the acquisition of the surface information in the process S15 may be performed in different inspection units U3. The cut width as the adjustment processing target is not limited to the cut width in the resist coating film (resist film R). The cut width as the adjustment processing target may be the cut width in any film formed on the surface Wa of the wafer W.

The substrate to be processed is not limited to the semiconductor wafer and may be, for example, a glass substrate, a mask substrate, a flat panel display (FPD), or the like.

According to the present disclosure, it is possible to provide the substrate processing method and the substrate processing apparatus capable of effectively using the substrate, which has been used in adjusting the cut width at the peripheral portion of the film.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing method, comprising:
    performing an adjustment processing including: forming a film on a surface of a substrate by a film forming unit configured to form the film on the surface of the substrate and remove at least a part of the film; removing a peripheral portion of the film by the film forming unit; adjusting a cut width of the peripheral portion based on surface information indicating a state of the surface of the substrate including the film, from which the peripheral portion has been removed; and peeling the film, from which the peripheral portion has been removed, by the film forming unit; and
    performing a process processing including: forming the film on the surface of the substrate by the film forming unit; and removing the peripheral portion by the cut width adjusted in the adjustment processing in the film forming unit.

2. The substrate processing method of claim 1, further comprising:
    repeatedly performing the adjustment processing until a deviation between the cut width and a target value reaches a predetermined level.

3. The substrate processing method of claim 2, wherein the adjustment processing is repeatedly performed by using a same substrate.

4. The substrate processing method of claim 1, wherein the adjustment processing comprises:
    carrying the substrate for the adjustment processing out of an accommodation unit that accommodates therein the substrate, on which the film has not been formed, by a transfer unit configured to transfer the substrate; and
    carrying the substrate, from which the film has been removed, into the accommodation unit by the transfer unit.

5. The substrate processing method of claim 1, wherein, in the adjustment processing, the cut width is adjusted by adjusting at least one of a holding position of the substrate on a rotation holder, which is configured to hold and rotate the substrate, or a position of a nozzle, which is configured to discharge a chemical liquid for removing the peripheral portion toward the substrate being rotated by the rotation holder, when the chemical liquid is discharged.

6. The substrate processing method of claim 1, further comprising:
    acquiring the surface information indicating the state of the surface of the substrate, on which the film has not been formed; and
    determining whether the substrate is allowed to be used in adjusting the cut width based on the surface information.

7. The substrate processing method of claim 1,
    wherein the film forming unit has multiple processing units each configured to form the film and remove at least the part of the film, and
    while performing the process processing in any one of the multiple processing units, at least a part of the adjustment processing is performed in another processing unit of the multiple processing units.

8. The substrate processing method of claim 1,
    wherein the film forming unit has multiple processing units each configured to form the film and removes at least the part of the film, and
    while performing the adjustment processing in any one of the multiple processing units, the adjustment processing is performed in another processing unit of the multiple processing units.

9. The substrate processing method of claim 1,
    wherein the film forming unit has a first processing unit configured to form the film and remove the peripheral portion and a second processing unit configured to peel the film, and
    in the adjustment processing of adjusting the cut width in the first processing unit, the film, from which the peripheral portion has been removed, is peeled by the second processing unit.

* * * * *